(12) United States Patent
Yamada et al.

(10) Patent No.: US 7,202,010 B2
(45) Date of Patent: Apr. 10, 2007

(54) CHEMICAL AMPLIFICATION TYPE POSITIVE RESIST COMPOSITION

(75) Inventors: Airi Yamada, Ibaraki (JP); Masumi Suetsugu, Toyonaka (JP); Yasunori Uetani, Toyonaka (JP)

(73) Assignee: Sumitomo Chemical Company Limited, Osaka (JP)

( * ) Notice: Subject to any disclaimer, the term of this patent is extended or adjusted under 35 U.S.C. 154(b) by 0 days.

(21) Appl. No.: 10/254,598

(22) Filed: Sep. 26, 2002

(65) Prior Publication Data

US 2003/0099900 A1  May 29, 2003

(30) Foreign Application Priority Data

Sep. 28, 2001  (JP) .............................. 2001-300867

(51) Int. Cl.
*G03F 7/039* (2006.01)
(52) U.S. Cl. ................... 430/270.1; 430/905; 430/907; 430/910
(58) Field of Classification Search ............. 430/270.1, 430/905, 910, 907
See application file for complete search history.

(56) References Cited

U.S. PATENT DOCUMENTS

| | | | |
|---|---|---|---|
| 5,939,234 A | 8/1999 | Yamanaka et al. | |
| 6,004,721 A | 12/1999 | Tan et al. | |
| 6,106,993 A | 8/2000 | Watanabe et al. | |
| 6,187,504 B1 | 2/2001 | Suwa et al. | |
| 6,284,863 B1 * | 9/2001 | Ohta et al. ................... | 528/215 |
| 2001/0023050 A1 * | 9/2001 | Numata et al. .......... | 430/270.1 |
| 2002/0147259 A1 * | 10/2002 | Namba et al. ............... | 524/377 |

FOREIGN PATENT DOCUMENTS

EP  1 091 250 A1  4/2001
JP  2001-66778 A  3/2001

OTHER PUBLICATIONS

Nozaki et al., "High etch-resistance EB resists employing adamantyl protective groups and thier application for 248 nm lithography", Journal of Photopolymer Science and Technology, vol. 13, No. 3 (2000) p. 397-404.*

* cited by examiner

Primary Examiner—Barbara L. Gilliam
(74) Attorney, Agent, or Firm—Birch, Stewart, Kolasch & Birch, LLP

(57) ABSTRACT

A chemical amplification type positive resist composition, which can reduce cost steeply without significantly decreasing basic abilities, is provided, and the chemical amplification type positive resist composition includes (A) a resin having a polymerization unit derived from p-hydroxystyrene and a polymerization unit of the formula (1) or formula (2)

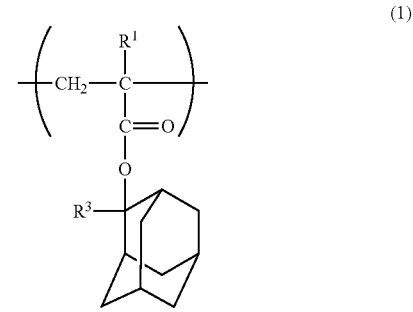

(1)

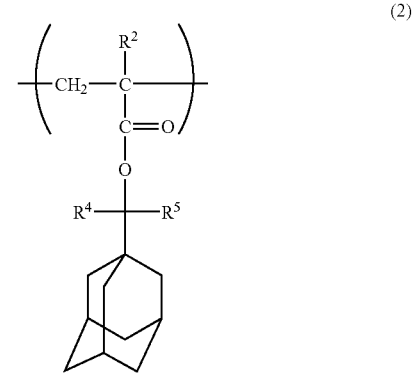

(2)

which is insoluble or poorly soluble itself in an alkali aqueous solution but becomes soluble in an alkali aqueous solution by the action of an acid, (B) a resin obtained by protecting a portion of the hydroxyl groups in poly(p-hydroxystyrene) with a protective group not dissociating by the action of an acid or a resin obtained by substituting a portion of the hydroxyl groups in poly(p-hydroxystyrene) with hydrogen, and (C) an acid generating agent.

4 Claims, No Drawings

CHEMICAL AMPLIFICATION TYPE POSITIVE RESIST COMPOSITION

BACKGROUND OF THE INVENTION

1. Field of the Invention

The present invention relates to a resist composition suitable for lithography and the like, acting by radiation ray of high energy such as far ultraviolet ray (including excimer laser and the like), electron beam, X ray or radiation light and the like.

2. Description of Related Art

Recently, with progress in higher integration of integrated circuits, there occurs a requirement for formation of submicron patterns. Particularly, lithography using excimer laser from krypton fluoride or argon fluoride is paid to attention since it enables production of 64 M DRAM to 1 G DRAM. As the resist suitable for such an excimer laser lithography process, there is a tendency to adoption of a so-called chemical amplification type resist utilizing chemical amplification effect. In the case of the chemical amplification type resist, an acid generated from an acid generating agent at parts irradiated with radiation diffuses by the subsequent heat treatment (post exposure bake: hereinafter, abbreviated as PEB), and solubility of the irradiated parts in an alkali developer is changed in a reaction using this acid as a catalyst, and by this, positive patterns are provided.

A chemical amplification type positive resist is characterized by containing of a resin insoluble or poorly soluble itself in an alkali aqueous solution but becoming soluble in an alkali aqueous solution by the action of an acid, and an acid generating agent. When a resin has an adamantane skeleton, the resin is expensive though it is excellent particularly in resolution.

An object of the present invention is to provide a chemical amplification type positive resist composition giving lowered cost without decreasing basic abilities such as sensitivity, resolution and the like.

The present inventors have intensively studied for attaining such an object and resultantly found that cost can be reduced steeply without significantly deteriorating basic abilities of a resist, by mixing a resin insoluble or poorly soluble itself in an alkali aqueous solution but becoming soluble in an alkali aqueous solution after dissociation of a protective group having a specific adamantine skeleton by the action of an acid, a resin obtained by protecting a part of hydroxyl groups in cheap poly(p-hydroxystyrene) by a protective group not dissociating by the action of an acid or a resin obtained by substituting a part of hydroxyl groups in cheap poly(p-hydroxystyrene) by hydrogen, as resin components of a chemical amplification type positive resist, leading to completion of the present invention.

SUMMARY OF THE INVENTION

Namely, the present invention provides a chemical amplification type positive resist composition comprising (A) a resin having a polymerization unit derived from p-hydroxystyrene and a polymerization unit of the formula (1) or formula (2)

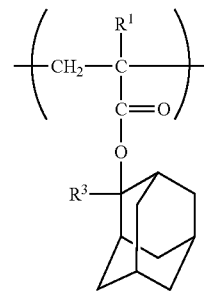

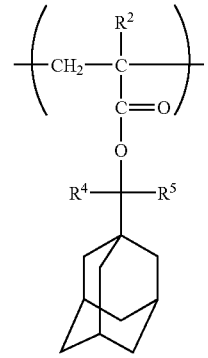

wherein, $R^1$ and $R^2$ represent each independently hydrogen or methyl group, and $R^3$ to $R^5$ represent each independently an alkyl group having 1 to 8 carbon atoms, and insoluble or poorly soluble itself in an alkali aqueous solution but becoming soluble in an alkali aqueous solution by the action of an acid, (B) a resin obtained by protecting apart of hydroxyl groups in poly(p-hydroxystyrene) by a protective group not dissociating by the action of an acid or a resin obtained by substituting a part of hydroxyl groups in poly(p-hydroxystyrene) by hydrogen, and (C) an acid generating agent.

EMBODIMENTS OF THE INVENTION

In the resist composition of the present invention, a resin having a polymerization unit derived from p-hydroxystyrene and a polymerization unit of either the formula (1) or formula (2), and insoluble or poorly soluble itself in an alkali aqueous solution but causing chemical change and becoming soluble in an alkali aqueous solution by the action of an acid, is used as one of resin components.

In the formula (1) and formula (2), $R^1$ and $R^2$ represent each independently hydrogen or methyl group, and $R^3$ to $R^5$ represent each independently an alkyl group having 1 to 8 carbon atoms. Specifically, methyl and ethyl are listed as $R^3$, $R^4$ and $R^5$.

The polymerization unit of the formula (1) or (2) has a group having an ability of suppressing dissolution into an alkali aqueous solution (hereinafter, sometimes referred to as protective group) but unstable to an acid, and this protective group is dissociated by the action of an acid. By this, the resin becomes soluble in an alkali aqueous solution.

As this protective group, residues of non-aromatic cyclic compounds such as 2-methyl-2-adamantyl, 2-ethyl-2-adamantyl, 1-(1'-adamantyl)methylethyl and the like are listed, and these groups will be substituted for hydrogen on carboxyl groups, by the action of an acid. These protective groups can be introduced into an acrylic resin by a known protective group introduction reaction. Further, the above-mentioned resin can be obtained also by copolymerization using as one monomer an unsaturated compound having such a group.

In the resist composition of the present invention, (B) a resin obtained by protecting a part of hydroxyl groups in poly(p-hydroxystyrene) by a protective group not dissociating by the action of an acid or a resin obtained by substituting apart of hydroxyl groups in poly(p-hydroxystyrene) by hydrogen, is used as one of resin components.

Specifically, preferable are resins obtained by protecting 10 to 50 mol % of hydroxyl groups in poly(p-hydroxystyrene) by a protective group not dissociating by the action of an acid or resins obtained by substituting 10 to 50% of hydroxyl groups in poly(p-hydroxystyrene) by hydrogen.

Examples of the protective group include alkoxy groups having 1 to 4 carbon atoms, alkoxycarbonyl groups having 1 to 4 carbon atoms in an alkyl part, acyl groups having 1 to 5 carbon atoms in total, acyloxy groups having 1 to 5 carbon atoms in total, and the like. Specific examples of alkoxy include methoxy, ethoxy, propoxy, butoxy and the like, and specific examples of alkoxy in alkoxycarbonyl are also the same. Specific examples of acyl include formyl, acetyl, propionyl, butylyl, valeryl, pivaloyl and the like, and specific examples of acyl in acyloxy are also the same.

When radiation ray such as light, electron beam and the like acts on an acid generating agent itself in the resist composition of the present invention or on the resist composition containing this substance, this substance is decomposed to generate and acid. An acid generating from an acid generating agent acts on the above mentioned resin to dissociate a group unstable to an acid present in the resin. Examples of such an acid generating agent include onium salt compounds, s-triazine-based organic halogen compounds, sulfone compounds, sulfonate compounds and the like. Specifically, the following compounds are listed.
Diphenyliodonium trifluoromethanesulfonate,
4-methoxyphenylphenyliodinium hexafluoroantimonate,
4-methoxyphenylphenyliodinium trifluoromethanesulfonate,
bis(4-tert-butylphenyl)iodonium tetrafluoroborate
bis(4-tert-butylphenyl)iodonium hexafluorophosphate,
bis(4-tert-butylphenyl)iodonium hexafluoroantimonate
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methylphenyldiphenylsulfonium perfluorobutanesulfonate,
4-methylphenyldiphenylsulfonium perfluorooctanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphtholylmethyl)thiolanium hexafluoroantimonate,
1-(2-naphtholylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
2-methyl-2,6-bis(trichloromethyl)-1,3,5-triazine,
2,4,6-tris(trichloromethyl)-1,3,5-triazine
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromeythyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (generally called benzoin tosylate),
2-benzoyl-2-hydroxy-2-phenylethyl p-toluenesulfonate (generally called α-methylolbenzoin tosylate),
1,2,3-benzenetolyl trismethanesulfonate,
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone
dis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide and the like.

The positive resist composition of the present invention can improve deterioration in abilities due to deactivation of an acid following leaving after exposure, by adding as a quencher an organic basic compound, particularly, a basic nitrogen-containing organic compound, for example, amines. Specific examples of the basic compound used as a quencher include compounds of the following formulae.

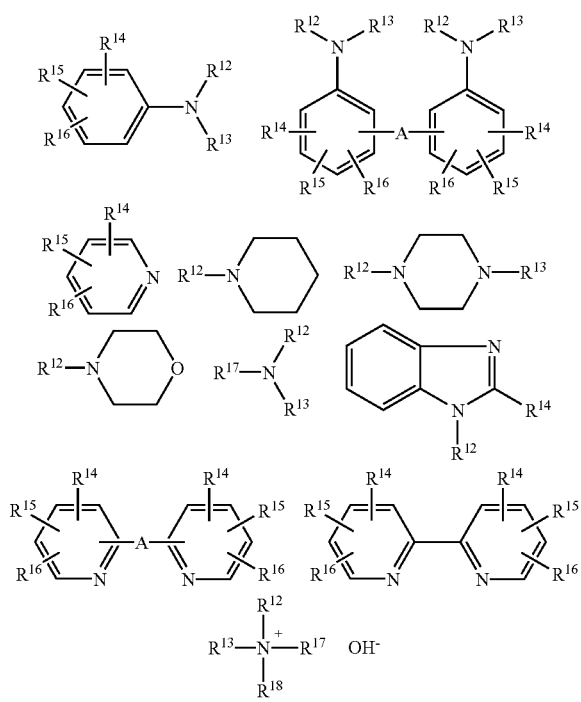

$R^{12}$, $R^{13}$ and $R^{18}$ represent each independently hydrogen, alkyl, cycloalkyl or aryl. The alkyl, cycloalkyl or aryl may be optionally substituted with, a hydroxyl group, amino group or alkoxy group having 1 to 6 carbon atoms. This amino group may be substituted with an alkyl group having 1 to 4 carbon atoms. This alkyl preferably has about 1 to 6 carbon atoms, this cycloalkyl preferably has about 5 to 10 carbon atoms, and this aryl preferably has about 6 to 10 carbon atoms.

$R^{14}$, $R^{15}$ and $R^{16}$ represent each independently hydrogen, alkyl, cycloalkyl, aryl or alkoxy. The alkyl, cycloalkyl, aryl or alkoxy may be optionally substituted with a hydroxyl group, amino group or alkoxy group having 1 to 6 carbon atoms. This amino group may be substituted with an alkyl group having 1 to 4 carbon atoms. This alkyl preferably has about 1 to 6 carbon atoms, this cycloalkyl preferably has about 5 to 10 carbon atoms, this aryl preferably has about 6 to 10 carbon atoms, and this alkoxy preferably has about 1 to 6 carbon atoms.

$R^{17}$ represents alkyl or cycloalkyl. The alkyl or cycloalkyl may be optionally substituted with a hydroxyl group, amino group or alkoxy group having 1 to 6 carbon atoms. This amino group may be substituted with an alkyl group having 1 to 4 carbon atoms. This alkyl preferably has about 1 to 6 carbon atoms, and this cycloalkyl preferably has about 5 to 10 carbon atoms.

A represents alkylene, carbonyl, imino, sulfide or disulfide. The alkylene preferably has about 2 to 6 carbon atoms.

$R^{12}$ to $R^{18}$ may have any of a linear structure and a branched structure providing they can take both structures.

Further, hindered amine compounds having a piperidine skeleton as disclosed in JP-A-11-52575 can also be used as a quencher.

It is preferable that the resist composition of the present invention contains 50 to 90% by weight of (A) a resin component having a polymerization unit derived from p-hydroxystyrene and a polymerization unit of the formula (1) or formula (2), 10 to 50% by weight of resin component obtained by protecting a part of hydroxyl groups in poly(p-hydroxystyrene) by a protective group not dissociating by the action of an acid or a resin obtained by substituting a part of hydroxyl groups in poly(p-hydroxystyrene) by hydrogen, and 0.1 to 20% by weight of an acid generating agent, based on the total solid content.

When a nitrogen-containing basic organic compound is contained as a quencher, this compound is used preferably in an amount of 10% by weight or less likewise based on the total solid content. Further, this composition can contain also a small amount of various additives such as sensitizers, dissolution suppressing agents, other resins, surfactants, stabilizers, dyes and the like.

The resist composition of the present invention usually takes a form of resist liquid composition containing components dissolved in a solvent, and applied on a substrate such as a silicon wafer and the like by an ordinary method. The solvent use here may be that dissolving the components, showing a suitable drying speed, and giving a uniform and smooth coated film after evaporation of the solvent. Those usually used in this field can be used. Examples thereof include glycol ether esters such as ethylcellosolve acetate, methylcellosolve acetate and propylene glycol monomethyl ether acetate; esters such as ethyl lactate, butyl acetate, amyl acetate and ethyl pyruvate; ketones such as acetone, methyl isobutyl ketone, 2-heptanone and cyclohexanone; cyclic esters such as γ-butyrolactone; alcohols such as 3-methoxy-1-butanol, and the like. These solvents can be used each alone or in combination of two or more.

A resist film applied on a substrate and dried is subjected to exposure treatment for patterning, then, subjected to heating treatment (PEB) for promoting a protective group-removing reaction, then, developer with an alkali developer. The alkali developer used here can be selected from various alkali aqueous solutions, and in general, aqueous solutions of tetramethylammonium hydroxide and (2-hydroxyethyl)trimethylammonium hydroxide (generally called coline) are often used.

The following examples will illustrate the present invention further specifically, but do not limit the scope of the present invention.

In the examples, % and parts representing the content or use amount are by weight unless otherwise state. The weight average molecular weight (Mw) and the polydispersion (Mw/Mn) is a valued measured by gel permeation chromatography using polystyrene as a standard.

Synthesis Example 1

Synthesis of 2-ethyl-2-adamantyl methacrylate and p-acetoxystyrene copolymer (30:70)

Into a flask were charged 59.6 g (0.24 mol) of 2-ethyl-2-adamantyl methacrylate, 90.8 g (0.56 mol) of p-acetoxystyrene and 279 g of isopropanol and an atmosphere in the flask was purged with nitrogen, and the mixture was heated up to 75° C. Into this solution, a solution prepared by dissolving 11.05 g (0.048 mol) of dimethyl-2,2'-azobis(2-methylpropionate) in 22.11 g of isopropanol was dropped. The mixture was aged at 75° C. for about 0.3 hours, and under reflux for about 12 hours, then, diluted with acetone, and charged in methanol to cause crystallization, and the crystal was removed by filtration.

The weight of the resulted crude crystal of the copolymer of 2-ethyl-2-adamantyl methacrylate and p-acetoxystyrene was 250 g.

Synthesis Example 2

Synthesis of 2-ethyl-2-adamantyl methacrylate and p-hydroxystyrene copolymer (30:70)

Into a flask were charged 250 g of the crude crystal of the copolymer of 2-ethyl-2-adamantyl methacrylate and p-acetoxystyrene (30:70) obtained in Synthesis Example 1, 10.8 g (0.088 mol) of 4-dimethylaminopyridine and 239 g of methanol, and aged for 20 hours under reflux. After cooling, the mixture was neutralized with 8.0 g (0.133 mol) of glacial acetic acid and charged in water to cause crystallization, and the crystal was removed by filtration. Thereafter, the crystal was dissolved in acetone, charged in water to cause crystallization, the crystal was removed by filtration, and this operation was repeated three times, then, the resulted crystal was dried.

The weight of the resulted crystal of the copolymer of 2-ethyl-2-adamantyl methacrylate and p-hydroxystyrene was 102.8 g. The weight-average molecular weight was about 8200, the degree of dispersion was 1.68 (GPC method: reduced by polystyrene), and the copolymerization ratio was analyzed by a nuclear magnetic resonance ($^{13}$C-NMR) spectrometer to be about 30:70. This resin is called resin A1.

Synthesis Example 3

Synthesis of 2-ethyl-2-adamantyl methacrylate/p-acetoxystyrene copolymer (20:80)

Into a flask were charged 39.7 g (0.16 mol) of 2-ethyl-2-adamantyl methacrylate, 103.8 g (0.64 mol) of p-acetoxystyrene and 265 g of isopropanol and the mixture was heated up to 75° C. under nitrogen atmosphere. Into this solution, a solution prepared by dissolving 11.05 g (0.048 mol) of dimethyl-2,2'-azobis(2-methylpropionate) in 22.11 g of isopropanol was dropped. The mixture was aged at 75° C. for about 0.3 hours, and under reflux for about 12 hours, then, diluted with acetone, and the reaction solution was poured into a large amount of methanol to precipitate a polymer which was filtrated.

The weight of the resulted copolymer of 2-ethyl-2-adamantyl methacrylate and p-acetoxystyrene was 250 g (weight of wet cake containing methanol).

Synthesis Example 4

Synthesis of 2-ethyl-2-adamantyl methacrylate/p-hydroxystyrene copolymer (20:80)

Into a flask were charged 250 g of the copolymer of 2-ethyl-2-adamantyl methacrylate and p-acetoxystyrene (20:80) obtained in Synthesis Example 3, 10.3 g (0.084 mol) of 4-dimethylaminopyridine and 202 g of methanol, and aged for 20 hours under reflux. After cooling, the reaction liquid was neutralized with 7.6 g (0.126 mol) of glacial acetic acid and poured into a large amount of water to precipitate a polymer. The deposited polymer was filtrated, dissolved in acetone, then, poured into a large amount of water to cause precipitation, and this operation was repeated three times in total for purification.

The weight of the resulted copolymer of 2-ethyl-2-adamantyl methacrylate and p-hydroxystyrene was 95.9 g. The copolymer had a weight-average molecular weight of about 8600, a degree of dispersion of 1.65 (GPC method: reduced by polystyrene), and the copolymerization ratio thereof was analyzed by a nuclear magnetic resonance ($^{13}$C-NMR) spectrometer to be about 20:80. This resin is called resin A2.

Synthesis Example 5

Synthesis of partial 1-isopropoxy of polyhydroxystyrene 30.0 parts (0.25 mol as vinylphenol unit) of poly(p-vinylphenol) ["VP-2500" manufactured by Nippon Soda Co., Ltd., weight-average molecular weight: 3500, degree of dispersion: 1.3] and 120 parts of acetone were charged into a reaction vessel, and stirred to be dissolved. Into this was charged 29.6 parts (0.21 mol) of anhydrous potassium carbonate and 18.2 parts (0.11 mol) of isopropyl iodide, and the mixture was heated until reflux. Subsequently, the reflux condition was maintained for 27 hours. After cooling, methyl isobutyl ketone was added and the organic layer was washed with a 2.0% oxalic acid aqueous solution four times, then, washed with ion exchanged water five times. The organic layer after washing was concentrated to 71 parts, and 206 parts of propylene glycol monomethyl ether acetate was added, and the mixture was concentrated further to 88.6 parts. The solid content of this concentrate was 31.9% by weight according to the heat weight reduction method. $^1$H-NMR measurement taught that 31.4% of hydroxyl groups in poly(p-vinylphenol) had been isopropyl etherified in the resin after reaction. This resin is called resin A3.

Synthesis Example 6

Synthesis 1 of polyhydroxystyrene partial 1-pivaloyloxy compound 20 parts (0.17 mol as vinylphenol unit) of poly(p-vinylphenol) ["PHS-15E01" manufactured by Chemical First Electronic Materials. Inc., weight-average molecular weight: 15000, degree of dispersion: 2.0] and 200 parts of acetone were charged, and stirred to be dissolved, then, to this was added 6.3 parts (0.06 mol) of triethylamine and the mixture was heated at 35° C. Into this resin solution was dropped 5.0 parts (0.04 mol, 0.25 equivalent based on hydroxyl groups in poly(p-vinylphenol)) of pivaloyl chloride over about 10 minutes. After stirring at 35° C. for 1.5 hours, 300 parts of methyl isobutyl ketone was added and washed with a 0.5% oxalic acid aqueous solution three times. The resulted organic layer was further washed with ion exchanged water and separated, and this operation was repeated five times. From this organic layer, the solvent was distilled off for concentration until the resin solution amount reached 70 parts. Thereafter, 200 parts of propylene glycol monomethyl ether acetate was added, and the mixture was further concentrated to 69 parts. The solid content of this concentrate was 30.6% by weight according to the heat weight reduction method. $^1$H-NMR measurement taught that 24.0% of hydroxyl groups in poly(p-vinylphenol) had been pivaloylated in the resin after reaction. This resin is called resin A4.

Synthesis Example 7

Synthesis 2 of polyhydroxystyrene partial 1-pivaloyloxy compound 30 parts (0.25 mol as vinylphenol unit) of poly(p-vinylphenol) [Linker M S-2p, manufactured by Maruzen Petrochemical Co.,Ltd., weight-average molecular weight:

6700, degree of dispersion: 3.37] and 300 parts of acetone were charged, and stirred to be dissolved. Then, to this was added 9.5 parts (0.09mol) of triethylamine and the mixture was heated at 35° C. Into this resin solution was dropped 7.5 parts (0.06 mol, 0.25 equivalent based on hydroxyl groups in poly(p-vinylphenol)) of pivaloyl chloride over about 10 minutes. After stirring at 35° C. for 3.0 hours, 300 parts of methyl isobutyl ketone was added and washed with a 0.5% oxalic acid aqueous solution three times. The resulted organic layer was further washed with ion exchanged water and separated, and this operation was repeated five times. From this organic layer, the solvent was distilled off for concentration until the resin solution amount reached 85 parts. Thereafter, 200 parts of propylene glycol monomethyl ether acetate was added, and the mixture was further concentrated to 83 parts. The solid content of this concentrate was 34.8% by weight according to the heat weight reduction method. $^1$H-NMR measurement taught that 24.3% of hydroxyl groups in poly(p-vinylphenol) had been pivaloylated in the resin after reaction. This resin is called resin A5.

Acid generating agent B1: bis(cyclohexylsulfonyl)diazomethane ["DAM-301", manufactured by Midori Kagaku Co.,Ltd.,]

Acid generating agent B2: triphenylsulfonium 2,4,6-triisopropylbenenesulfonate

Quencher C1: 2,6-diisopropylaniline

EXAMPLES 1 TO 4 AND COMPARATIVE EXAMPLE 1

Resins (13.5 parts in total, reduced by solid content) were mixed in ratios (reduced by solid content) shown in Table 1 and dissolved with 0.049 parts of quencher C1, 0.6 parts of acid generating agent B1 and 0.45 parts of acid generating agent B2 in propylene glycol monomethyl ether acetate as a dilution solvent. The resulting solution was filtrated through a fluorine resin filter having a pore diameter of 0.2 μm to prepare a resist solution.

On a silicon wafer on which an organic reflection preventing film (BARC) had been applied, the resist solution was applied using a spin coator so that the film thickness after drying was 0.42 μm. The organic reflection preventing film was formed by applying "DUV-42" manufactured by Brewer at 215° C. for 60 seconds so that the film thickness was 600 Å. Prebake after application of the resist solution was conducted at 110° C. for 60 seconds on a hot plate. The wafer on which a resist film had thus been formed was exposed to line and space pattern using a KrF excimer laser exposure machine ("NSR S203B" manufactured by Nikon Corp., NA=0.68, σ=0.75, 2/3 Annular illumination exposure or "NSR 2205 EX12B" manufactured by Nikon Corp., NA=0.55, σ=0.8, 2/3 Annular illumination exposure). Then, post exposure bake was conducted at temperatures shown in Table 2 for 60 seconds on a hot plate, further, paddle development was conducted for 60 seconds with a 2.38 wt % tetramethylammonium hydroxide aqueous solution. Pattern after development was observed by a scanning electron microscope, and the effective sensitivity, resolution and profile were checked by the following methods and the results are shown in Table 2.

Effective sensitivity: It is represented by exposure amount under which line and space pattern of 0.15 μm shows a ratio of 1:1 in the case of the exposure machine S203B and line and space pattern of 0.20 μm shows a ratio of 1:1 in the case of the exposure machine EX12B.

Resolution: It is represented by the minimum size of line and space pattern separating at the exposure amount of the effective sensitivity.

TABLE 1

| Example No. | Resin | |
| --- | --- | --- |
| Example 1 | A1/50% | A3/50% |
| Example 2 | A1/50% | A4/50% |
| Example 3 | A2/50% | A4/50% |
| Example 4 | A1/50% | A5/50% |
| Comparative example 1 | A1/50% | A2/50% |

TABLE 2

| Example No. | Exposure machine | Effective sensitivity [mJ/cm$^2$] | Resolution [μm] |
| --- | --- | --- | --- |
| Example 1 | S203B | 35 | 0.13 |
| Example 2 | S203B | 43 | 0.13 |
| Example 3 | EX12B | 47 | 0.17 |
| Example 4 | EX12B | 42 | 0.16 |
| Comparative example 1 | S203B | 35 | 0.13 |
| | EX12B | 45 | 0.16 |

The chemical amplification type positive resist composition of the present invention can reduce cost steeply without significantly decreasing basic abilities such as sensitivity, resolution and the like.

What is claimed is:
1. A chemical amplification type positive resist composition comprising
(A) a resin having a polymerization unit derived from p-hydroxystyrene and a polymerization unit of the formula (1) or formula (2)

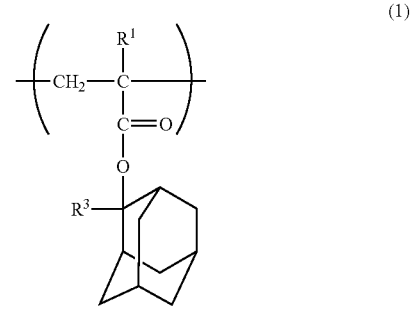

(1)

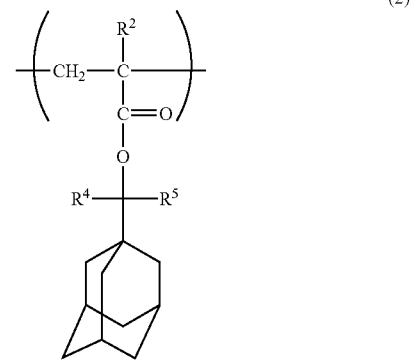

(2)

wherein, $R^1$ and $R^2$ each independently represent hydrogen or methyl group, and $R^3$ to $R^5$ each independently represent an alkyl group having 1 to 8 carbon atoms, wherein the resin is insoluble or poorly soluble itself in an alkali aqueous solution but becomes soluble in an aqueous solution by the action of an acid;
 (B) a resin obtained by protecting a portion of hydroxyl groups in poly(p-hydroxystyrene) with a protective group not dissociating by the action of an acid; and
 (C) an acid generating agent,
wherein the protective group is an isopropoxy group or 1-pivaloyloxy group.

2. The chemical amplification type positive resist composition according to claim 1, wherein $R^1$ and $R^2$ are methyl, and $R^3$, $R^4$ and $R^5$ are each independently methyl or ethyl.

3. The chemical amplification type positive resist composition according to claim 1, wherein the resin (B) is obtained by protecting 10 to 50 mol % of hydroxyl groups in poly(p-hydroxystyrene) with a protective group not dissociating by the action of an acid.

4. The chemical amplification type positive resist composition according to claim 1, which comprises 50 to 90% by weight of (A) a resin component having a polymerization unit derived from p-hydroxystyrene and a polymerization unit of the formula (1) or formula (2), 10 to 50% by weight of (B) a resin component obtained by protecting a portion of hydroxyl groups in poly(p-hydroxystyrene) with a protective group not dissociating by the action of an acid and 0.1 to 20% by weight of an acid generating agent, based on the total solid content.

* * * * *